(12) United States Patent
Shin et al.

(10) Patent No.: US 12,255,662 B2
(45) Date of Patent: Mar. 18, 2025

(54) MASTER REFERENCE OSCILLATOR SYSTEM

(71) Applicant: ELECTRONICS AND TELECOMMUNICATIONS RESEARCH INSTITUTE, Daejeon (KR)

(72) Inventors: Dong Hwan Shin, Daejeon (KR); Dong Pil Chang, Daejeon (KR); Seong Mo Moon, Daejeon (KR); Byoung-Sun Lee, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 229 days.

(21) Appl. No.: 17/977,074

(22) Filed: Oct. 31, 2022

(65) Prior Publication Data

US 2023/0216511 A1 Jul. 6, 2023

(30) Foreign Application Priority Data

Dec. 31, 2021 (KR) .......................... 10-2021-0193803

(51) Int. Cl.
*H03L 7/099* (2006.01)

(52) U.S. Cl.
CPC .................. *H03L 7/0991* (2013.01)

(58) Field of Classification Search
CPC ....... H03L 7/0991; H03L 7/00; H03L 7/0807; H03L 7/085
See application file for complete search history.

(56) References Cited

U.S. PATENT DOCUMENTS

| 8,737,528 | B2 | 5/2014 | Shin et al. |
| 10,374,308 | B2 | 8/2019 | Thoreback |
| 2015/0256128 | A1* | 9/2015 | Moon .................. H03F 3/68 330/124 R |

FOREIGN PATENT DOCUMENTS

| JP | 2008-035111 A | 2/2008 |
| KR | 10-2015-0103863 A | 9/2015 |

* cited by examiner

*Primary Examiner* — Jeffrey M Shin
(74) *Attorney, Agent, or Firm* — LRK PATENT LAW FIRM

(57) ABSTRACT

A master reference oscillator system is provided. The master reference oscillator system includes a plurality of reference oscillators and a hybrid matrix receiving signals from the plurality of reference oscillators and outputting a plurality of output signals having the same signal magnitude, wherein at least two output signals among the plurality of output signals may have a phase difference.

11 Claims, 7 Drawing Sheets

MASTER REFERENCE OSCILLATOR SYSTEM

CROSS-REFERENCE TO RELATED APPLICATION

This application claims priority to and the benefit of Korean Patent Application No. 10-2021-0193803 filed in the Korean Intellectual Property Office on Dec. 31, 2021, the entire contents of which are incorporated herein by reference.

BACKGROUND OF THE DISCLOSURE

1. Field of the Disclosure

The present disclosure relates to a reference oscillator system used for a satellite communication payload, and more particularly, to a reference oscillator system used for phase locking of local oscillators in a system using a plurality of local oscillators.

2. Description of Related Art

A reference oscillator is a frequency generator that is a reference so that a local oscillator, an essential part of a frequency converter used for frequency conversion in a communication system, outputs a stable frequency signal. The local oscillator may generate a stable frequency signal by phase-locking a reference oscillator signal through a phase-locked loop (PLL) circuit or the like.

A communication repeater system may be configured using a plurality of frequency converters according to a structure thereof. In a system requiring high reliability, such as a satellite communication payload system, a redundancy is included to improve reliability. In this case, the number of necessary devices is further increased. The local oscillators of all frequency converters in the system should each receive a reference frequency signal. At this time, an output signal of one reference oscillator may be branched and supplied to each frequency converter (local oscillator), and this is a master reference oscillator.

SUMMARY OF THE DISCLOSURE

The present disclosure has been made in an effort to provide a master reference oscillator having advantages of reducing a change in input impedance by configuring a power divider using a 90-degree hybrid and a 180-degree hybrid in a master reference oscillator system.

An example embodiment of the present disclosure provides a master reference oscillator system including a plurality of reference oscillators; and a hybrid matrix receiving signals from the plurality of reference oscillators and outputting a plurality of output signals having the same signal magnitude, wherein at least two output signals among the plurality of output signals may have a phase difference.

The hybrid matrix may include a 90-degree hybrid and a 180-degree hybrid.

The hybrid matrix may include one or more termination resistors.

The reference oscillator may have an n:1 redundancy structure (n is a natural number greater than 1).

The reference oscillator may include a main device and a redundancy, and the master reference oscillator system further includes a switch performing switching between the main device and the redundancy.

Another example embodiment of the present disclosure provides a master reference oscillator system including: a plurality of reference oscillators including a main device and a redundancy; a switch performing switching between the main device and the redundancy; and a hybrid matrix receiving an output signal from the switch and outputting a plurality of output signals having the same signal magnitude, wherein at least two of the plurality of output signals have a phase difference.

The hybrid matrix may include a 90-degree hybrid and a 180-degree hybrid.

The hybrid matrix may include one or more termination resistors.

The reference oscillator may have an n:1 redundancy structure (n is a natural number greater than 1).

Yet another example embodiment of the present disclosure provides a master reference oscillator system including: a plurality of reference oscillators; a first hybrid matrix receiving signals from the plurality of reference oscillators and outputting a plurality of first output signals having the same signal magnitude; and a second hybrid matrix receiving the plurality of first output signals from the first hybrid matrix and outputting a plurality of second output signals having the same signal magnitude, wherein at least two of the plurality of first output signals have a phase difference, and at least two of the plurality of second output signals have a phase difference.

The hybrid matrix may include a 90-degree hybrid and a 180-degree hybrid.

The hybrid matrix may include one or more termination resistors.

The reference oscillator may have an n:1 redundancy structure (n is a natural number greater than 1).

According to the configuration of the present disclosure, a power divider that minimizes a change in input impedance is implemented through a hybrid matrix combining a 90-degree hybrid and a 180-degree hybrid, and a master reference oscillator system using the same may be implemented. The master reference oscillator system of the present disclosure is particularly useful for improving frequency pulling performance of a reference oscillator in a system having a main device and a redundancy, such as a satellite communication payload system. As shown in the example embodiment, the master reference oscillator system of the present disclosure may be applied in various configurations in a communication system using a master reference oscillator.

DETAILED DESCRIPTION OF THE EXAMPLE EMBODIMENTS

Figure 1:
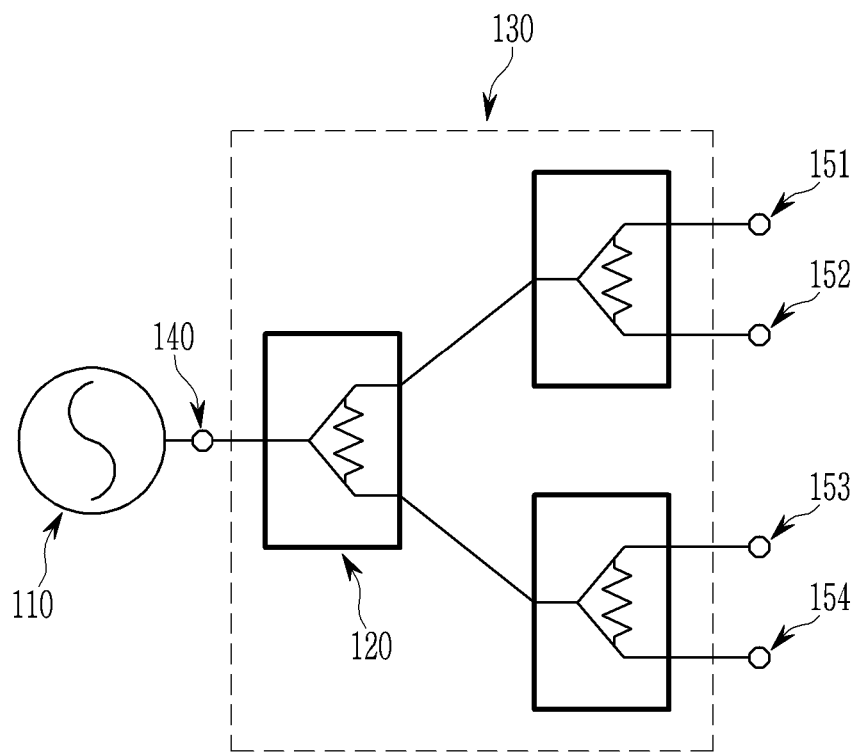
FIG. 1 is a view showing a master reference oscillator configured by coupling a power divider (1:4) according to the related art to a reference oscillator.

Hereinafter, the present disclosure will be described more fully hereinafter with reference to the accompanying drawings, in which example embodiments of the disclosure are shown. As those skilled in the art would realize, the described example embodiments may be modified in various different ways, all without departing from the spirit or scope of the present disclosure. Accordingly, the drawings and description are to be regarded as illustrative in nature and not restrictive. Like reference numerals designate like elements throughout the specification.

Throughout the specification and claims, unless explicitly described to the contrary, the word "comprise", and variations such as "comprises" or "comprising", will be understood to imply the inclusion of stated elements but not the exclusion of any other elements.

FIG. 1 is a block diagram of a master reference oscillator combining a power divider (1:4) according to the related art to a reference oscillator. A signal of the reference oscillator 110 is divided into ¼ magnitude and output through the 1:4 power divider 130 using three 1:2 power dividers 120 that divide and output the signal magnitude equally. In such a master reference oscillator, when input impedance of a device connected to outputs 151, 152, 153, and 154 is matched, the master reference oscillator operates without being affected in performance thereof, but if matching is not properly performed with the connected device, the impedance of the input 140 of a 1:4 power divider 130 may be changed, resulting in frequency pulling of the signal of the reference oscillator.

In particular, a satellite communication payload system has a redundancy whose power is turned off in a normal mode, and thus, the impedance of the input 140 of the power divider may change more significantly due to a large impedance difference between a main device and the redundancy, so a possibility of frequency pulling of the reference oscillator signal is further increased.

An object of the present disclosure is to provide a master reference oscillator with less change in input impedance by configuring a power divider using a 90-degree hybrid and a 180-degree hybrid in a master reference oscillator system to solve such a problem.

In order to achieve the object as described above, the present disclosure provides a master reference oscillator system including a power divider having a 90-degree and 180-degree hybrid matrix structure.

Figure 2:
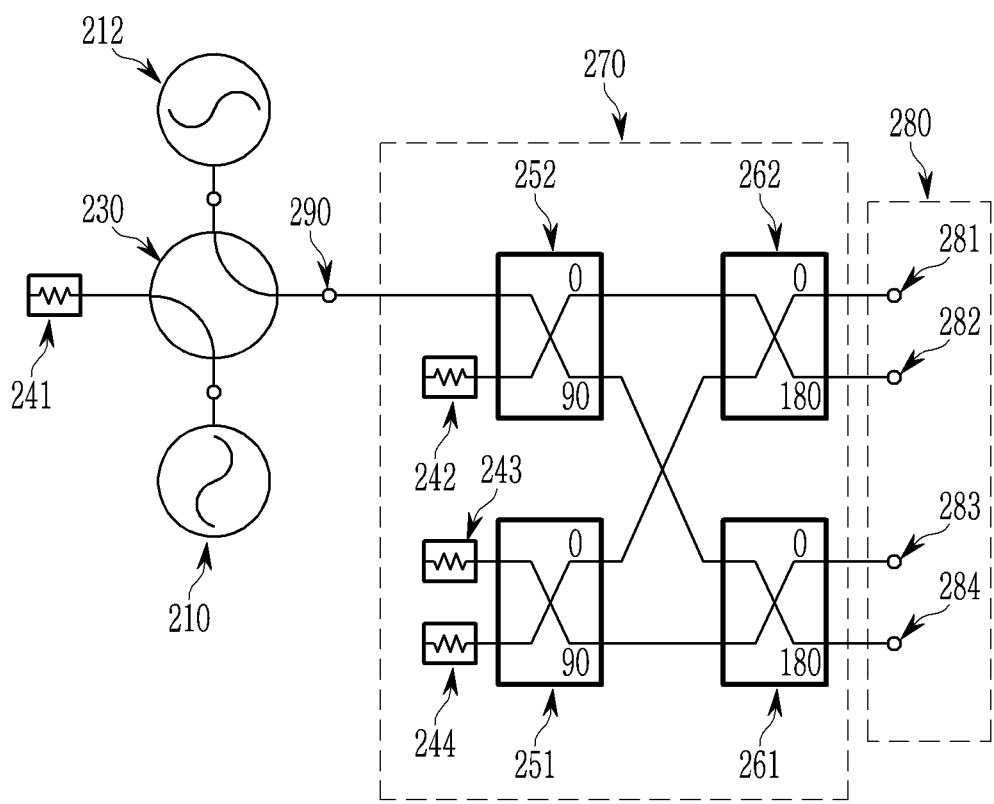
FIG. 2 is a diagram showing the basic circuit of the master reference oscillator system of the present disclosure.

FIG. 2 shows a basic circuit of a master reference oscillator system of the present disclosure. One of the two reference oscillators 210 and 212 has a 2:1 redundancy structure that operates as a redundancy, and switching between the main device and the redundancy is performed through a switch 230. One unused terminal among the four terminals of the switch is connected to a termination resistor 241. A signal from the reference oscillator 210 or 212 is input to a hybrid matrix 270 and is distributed to four signals having the same size at an output terminal 280.

The hybrid matrix includes two 90-degree hybrids 251 and 252 and two 180-degree hybrids 261 and 262, and three unused terminals of the input is terminated with resistors 242, 243, and 244. A magnitude of the hybrid matrix 4-terminal output signal is output to be equal to ¼ of the magnitude of the input signal, but phases at each output terminal have a difference of 0 degrees (281), 0 degrees (282), 90 degrees (283), 90 degrees (284), compared to the input phase. In such a hybrid matrix structure, even if impedance mismatch occurs with a device connected to any one or a plurality of the output terminals due to a phase difference occurring in each hybrid, a deterioration of input return loss of the hybrid matrix may be minimized.

Figure 3:
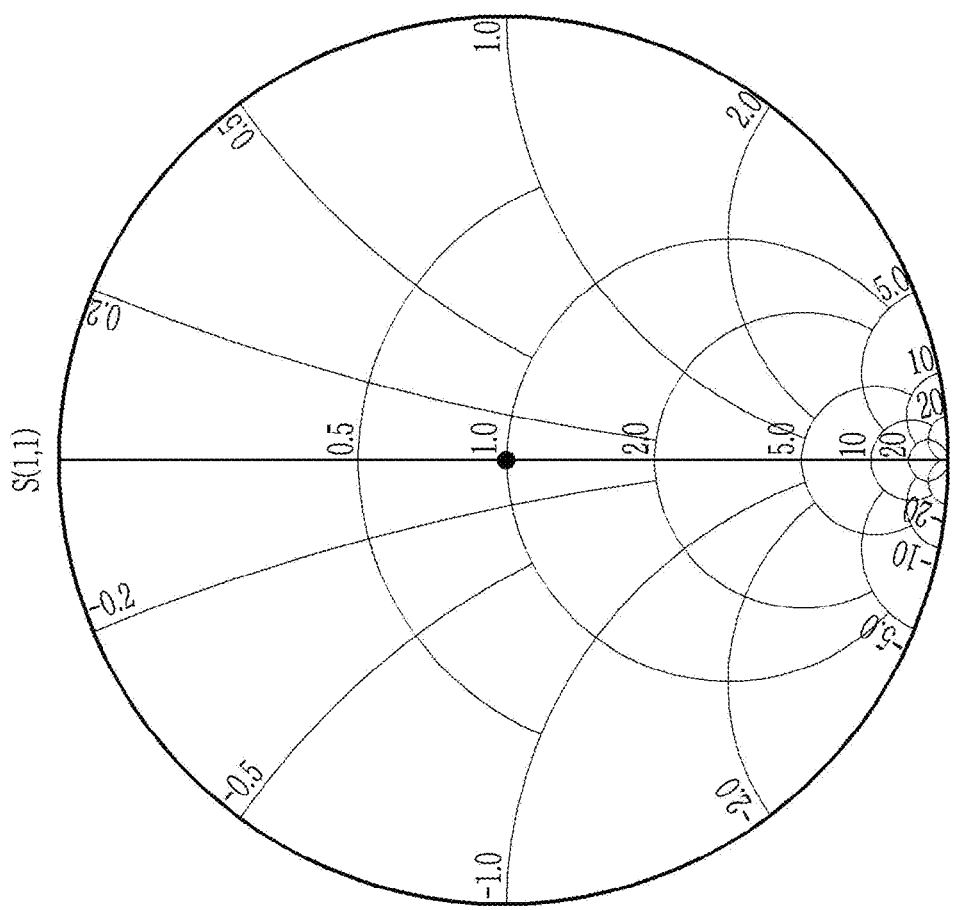
FIGS. 3 and 4 are diagrams showing impedance accuracy of a master reference oscillator system of the present disclosure.

In order to describe the present disclosure in detail, simulation results for the hybrid matrix 270 of FIG. 2 are provided as an example. FIG. 3 shows impedance matching of an input terminal 290 of a hybrid matrix when all the devices connected to the output terminal 280 of the master reference oscillator (FIG. 2) operate normally and when the 4:2 redundancy ((one of 281,282), (one of 283,284)) operates. Impedance when no device operates is assumed to be an open state, and in this case, impedance is accurately matched to the reference oscillator (switch) so that a signal is divided and output without any influence on the reference oscillator 210 or 212.

Figure 4:
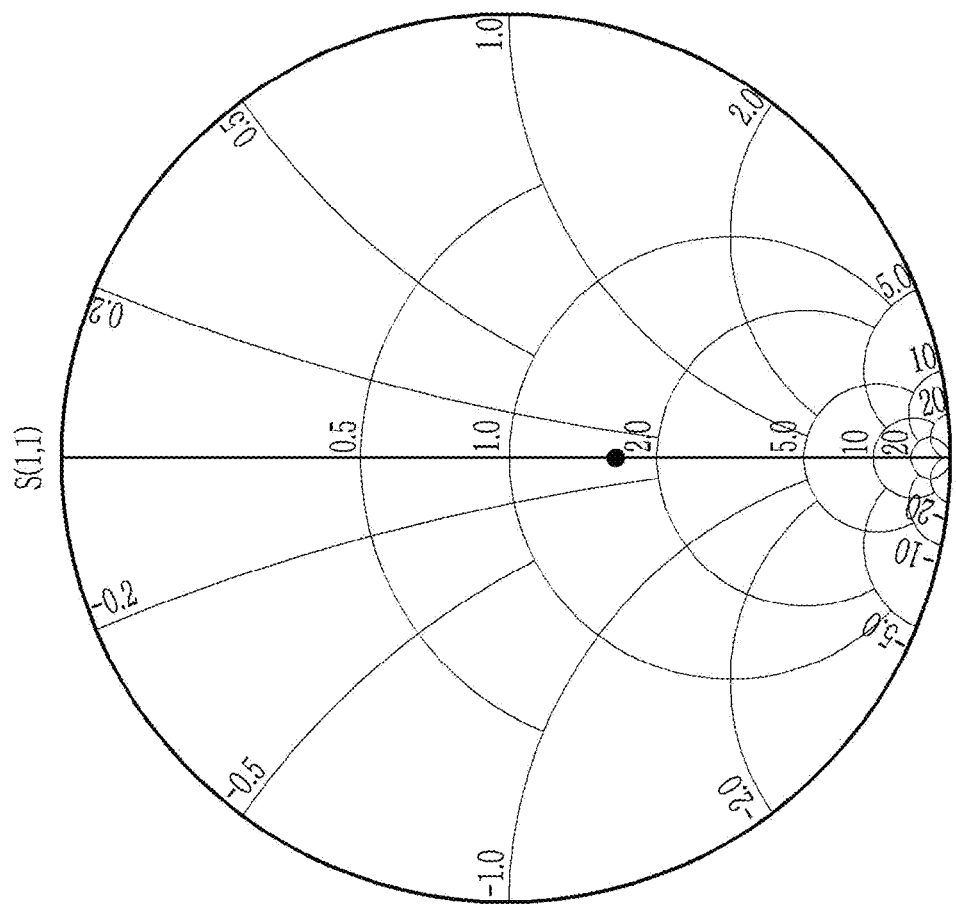

FIG. 4 shows impedance matching of the input terminal 290 of the hybrid matrix when three of the four devices connected to the output terminal 280 of the master reference oscillator (FIG. 2) operate normally and when only any one thereof operates. In this case, an input VSWR is about 1.67:1 (12 dB return loss), which shows relatively good matching performance, so frequency pulling due to pulling performance of the reference oscillator may be minimized.

Figure 5:
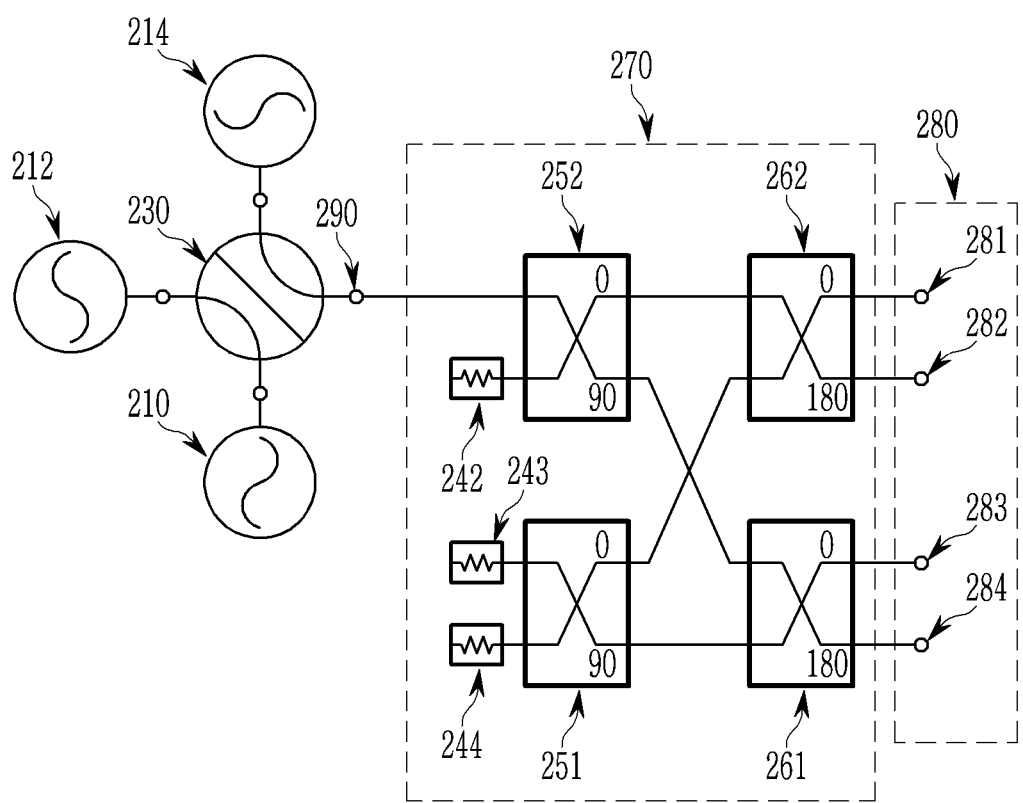
FIGS. 5 and 6 are views showing an expanded structure of the master reference oscillator system of FIG. 2.
Figure 6:
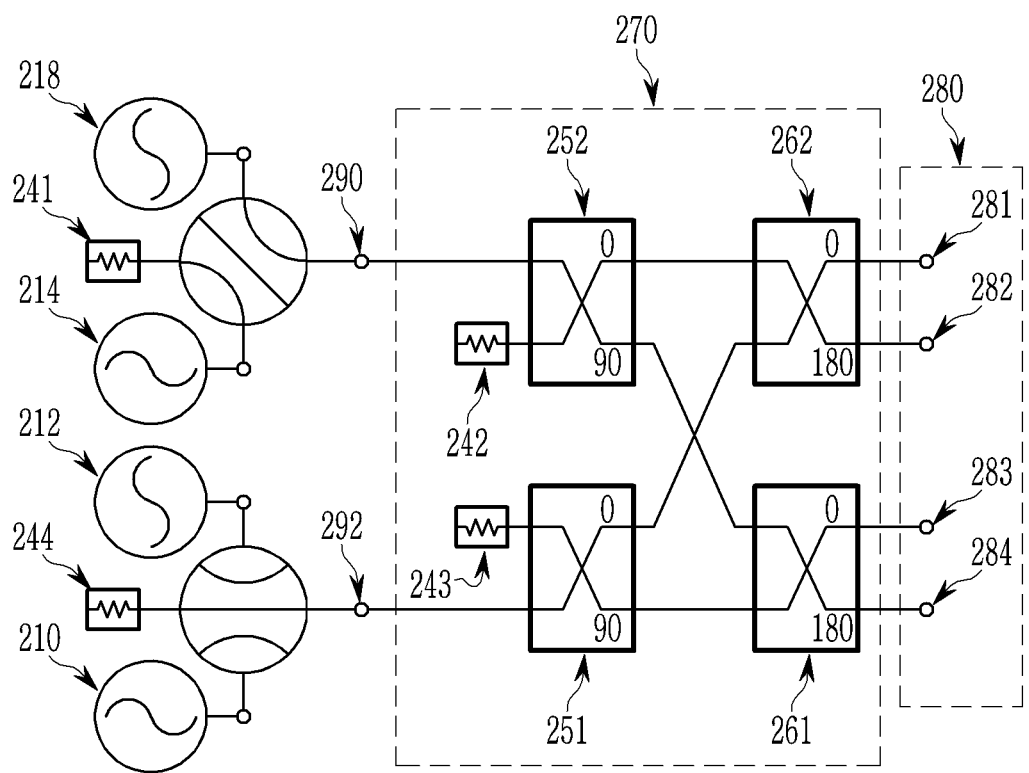

FIGS. 5 and 6 are an expanded structure of the master reference oscillator system of FIG. 2, FIG. 5 shows a structure in which the reference oscillator has a 3:1 redundancy structure, and FIG. 6 shows a master reference oscillator system in which a reference oscillator has a 4:1 redundancy structure.

Figure 7:
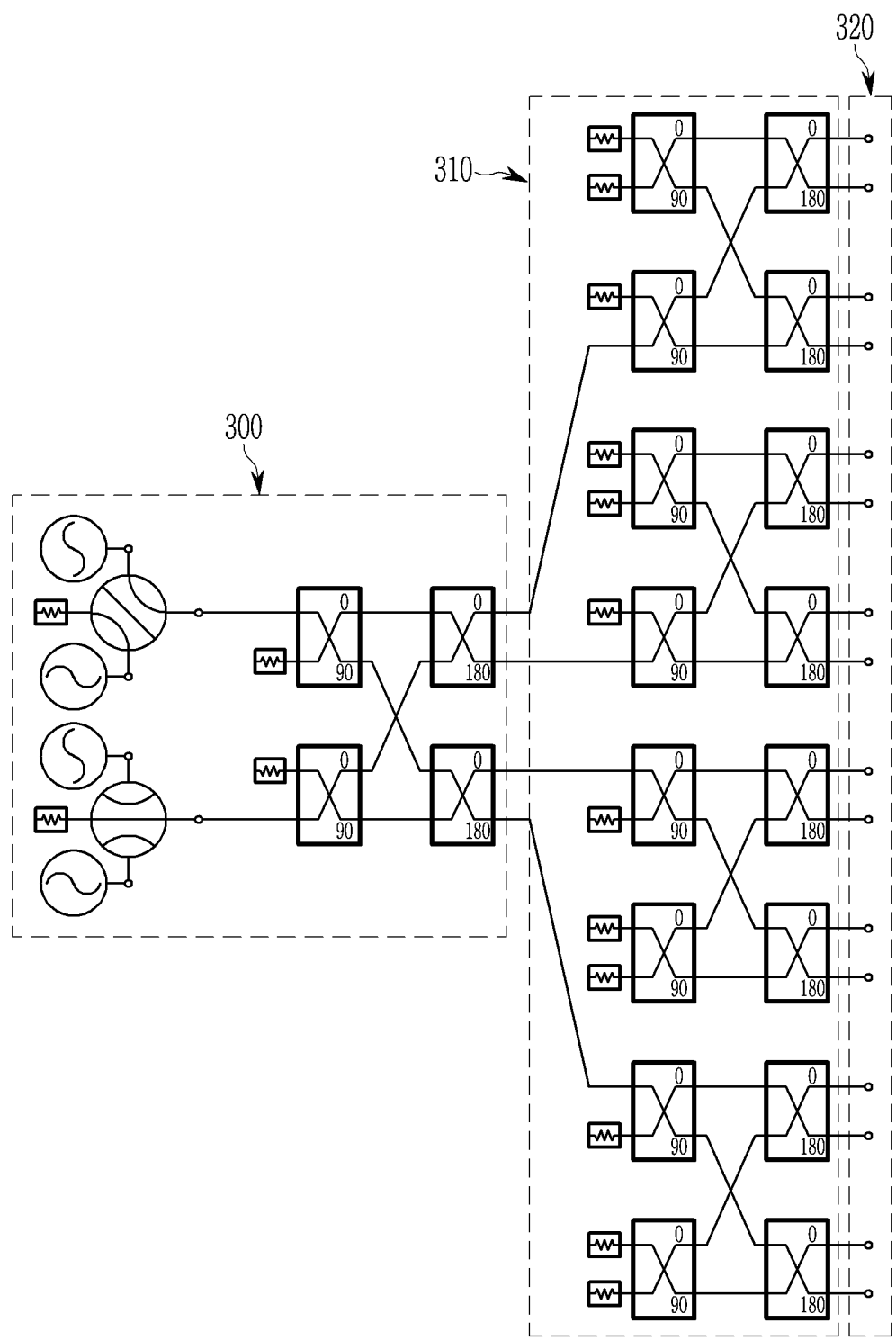
FIG. 7 is a diagram illustrating a 1:16 master reference oscillator system in which a reference oscillator further expanding FIG. 6 has a 4:1 redundancy structure.

FIG. 7 is a diagram illustrating a 1:16 master reference oscillator system in which the reference oscillator of further expanding FIG. 6 has a 4:1 redundancy structure. As described above, based on the basic structure of FIG. 2, the master reference oscillator system may be expanded to various structures, such as 1:4, 1:8, 1:16, and the like.

While the present disclosure has been described in connection with example embodiments, it is to be understood that the disclosure is not limited to the disclosed example embodiments, but, on the contrary, is intended to cover various modifications and equivalent arrangements included within the spirit and scope of the appended claims.

While this disclosure has been described in connection with what is presently considered to be practical example embodiments, it is to be understood that the disclosure is not limited to the disclosed example embodiments. On the contrary, it is intended to cover various modifications and equivalent arrangements included within the spirit and scope of the appended claims.

What is claimed is:

1. A master reference oscillator system comprising:
   a plurality of reference oscillators; and
   a hybrid matrix receiving signals from the plurality of reference oscillators and outputting a plurality of output signals having the same signal magnitude,
   wherein at least two of the plurality of output signals have a phase difference,
   wherein the hybrid matrix includes one or more termination resistors.

2. The master reference oscillator system of claim 1, wherein the hybrid matrix includes a 90-degree hybrid and a 180-degree hybrid.

3. The master reference oscillator system of claim 1, wherein the reference oscillator has an n:1 redundancy structure, where n is a natural number greater than 1.

4. The master reference oscillator system of claim 1, wherein the reference oscillator includes a main device and a redundancy,
   wherein the master reference oscillator system further comprises a switch performing switching between the main device and the redundancy.

5. A master reference oscillator system comprising:
a plurality of reference oscillators;
a first hybrid matrix receiving signals from the plurality of reference oscillators and outputting a plurality of first output signals having the same signal magnitude; and
a second hybrid matrix receiving the plurality of first output signals from the first hybrid matrix and outputting a plurality of second output signals having the same signal magnitude,
wherein at least two of the plurality of first output signals have a phase difference, and at least two of the plurality of second output signals have a phase difference,
wherein the hybrid matrix includes one or more termination resistors.

6. A master reference oscillator system comprising:
a plurality of reference oscillators including a main device and a redundancy;
a switch performing switching between the main device and the redundancy; and
a hybrid matrix receiving an output signal from the switch and outputting a plurality of output signals having the same signal magnitude,
wherein at least two of the plurality of output signals have a phase difference.

7. The master reference oscillator system of claim 6, wherein the hybrid matrix includes a 90-degree hybrid and a 180-degree hybrid.

8. The master reference oscillator system of claim 6, wherein the hybrid matrix includes one or more termination resistors.

9. The master reference oscillator system of claim 6, wherein the reference oscillator has an n:1 redundancy structure, where n is a natural number greater than 1.

10. The master reference oscillator system of claim 5, wherein the reference oscillator has an n:1 redundancy structure, where n is a natural number greater than 1.

11. The master reference oscillator system of claim 5, wherein the first hybrid matrix and the second hybrid matrix include a 90-degree hybrid and a 180-degree hybrid.

* * * * *